(12) United States Patent
Krueger et al.

(10) Patent No.: US 11,776,790 B2
(45) Date of Patent: Oct. 3, 2023

(54) APPARATUS AND METHOD FOR COATING AND IN PARTICULAR PLASMA COATING OF CONTAINERS

(71) Applicant: KRONES AG, Neutraubling (DE)

(72) Inventors: Jochen Krueger, Hagelstadt (DE); Nadine Ortner, Schorndorf (DE)

(73) Assignee: KRONES AG, Neutraubling (DE)

( * ) Notice: Subject to any disclaimer, the term of this patent is extended or adjusted under 35 U.S.C. 154(b) by 443 days.

(21) Appl. No.: 16/705,298

(22) Filed: Dec. 6, 2019

(65) Prior Publication Data

US 2020/0194232 A1 Jun. 18, 2020

(30) Foreign Application Priority Data

Dec. 18, 2018 (DE) ...................... 10 2018 132 700.5

(51) Int. Cl.
*H01J 37/32* (2006.01)
*C23C 16/50* (2006.01)

(52) U.S. Cl.
CPC ........ *H01J 37/32137* (2013.01); *C23C 16/50* (2013.01); *H01J 37/3244* (2013.01);
(Continued)

(58) Field of Classification Search
CPC ... C23C 16/515; C23C 16/402; C23C 16/045; C23C 16/54; C23C 16/52;
(Continued)

(56) References Cited

U.S. PATENT DOCUMENTS

2003/0137251 A1* 7/2003 Mitrovic ........... H01J 37/32532
315/39
2007/0187280 A1* 8/2007 Haines .................... A61L 27/34
206/528
(Continued)

FOREIGN PATENT DOCUMENTS

CN 102469676 A 5/2012
CN 103320773 A 9/2013
(Continued)

OTHER PUBLICATIONS

Chinese Office Action dated Aug. 30, 2021 for Application No. 2019112825309.

*Primary Examiner* — Yuechuan Yu
(74) *Attorney, Agent, or Firm* — Schmeiser, Olsen & Watts, LLP

(57) ABSTRACT

Provided is an apparatus and a method for coating objects and in particular containers with at least one first and one second coating station, wherein these coating stations each have at least one first coating electrode and one second coating electrode, and with a supply device for electrical supply of in each case at least one of the coating electrodes. The supply device has a high-frequency generator device for generating an a.c. voltage and/or voltage pulses as well as an a.c. voltage distribution device which distributes this a.c. voltage and/or the voltage pulses respectively to in each case at least one electrode of the first coating station and at least one electrode of the second coating station, wherein the a.c. voltage distribution device is suitable and intended for distributing the a.c. voltages and/or the voltage pulses with a time delay to the electrodes.

15 Claims, 2 Drawing Sheets

(52) U.S. Cl.
CPC .. *H01J 37/32146* (2013.01); *H01J 37/32394* (2013.01); *H01J 2237/332* (2013.01)

(58) Field of Classification Search
CPC ........... H01J 37/32889; H01J 37/32394; H01J 37/32146; H01J 37/32091; H01J 37/32137; H01J 37/3244; H01J 2237/332
See application file for complete search history.

(56) References Cited

U.S. PATENT DOCUMENTS

| | | | |
|---|---|---|---|
| 2011/0083808 A1* | 4/2011 | Kagoshima ....... | H01J 37/32935 156/345.24 |
| 2013/0251917 A1* | 9/2013 | Krueger ................ | C23C 16/045 118/712 |

FOREIGN PATENT DOCUMENTS

| | | |
|---|---|---|
| DE | 196 34 795 A1 | 3/1998 |
| DE | 4447977 B4 | 9/2009 |
| DE | 10 2011 055125 A1 | 5/2012 |
| DE | 102011104730 A1 | 12/2012 |
| DE | 10 2018 204585 A1 | 10/2018 |
| EP | 2 151 510 A1 | 2/2010 |
| JP | 2004169087 A | 6/2004 |
| JP | 2018123370 A | 8/2018 |

* cited by examiner

APPARATUS AND METHOD FOR COATING AND IN PARTICULAR PLASMA COATING OF CONTAINERS

CROSS-REFERENCE TO RELATED APPLICATION

This application claims priority to German Application No. 10 2018 132 700.5, having a filing date of Dec. 18, 2018, the entire contents of which are hereby incorporated by reference.

FIELD OF TECHNOLOGY

The following relates to an apparatus and a method for coating and in particular plasma coating of containers. It has been known for a long time from the conventional art that containers, in particular plastic containers, are coated in particular on their (inner) surface. In this way a diffusion of liquid or gas from the interior of the container to the exterior or also an ingress of gases from the exterior into the product can be prevented.

BACKGROUND

Thus, for example coatings with silicon oxide are known. For this purpose, for example, one or two electrodes can be introduced into the interior of the container and are subjected to voltage pulses. For the coating of surfaces with, for example, silicon oxide, usually plasma methods (PECVD=plasma-enhanced chemical vapour deposition) are generally used. In this case a silicon-containing precursor (for example HMDSO, HMDSM, TEOS or other Si-containing compounds) is vaporised and introduced together with oxygen into a vacuum. The gas molecules are then broken down more or less completely into their constituents by a plasma and then recombine into new compounds, inter alia $SiO_2$, which is deposited on the surface.

For example, plastic bottles are coated for improvement of gas barrier properties, but the most varied surfaces are also coated in this way.

The decomposition of the gas molecules usually takes place by the supply of energy, for example by intensive electromagnetic radiation, such as for example microwave, high-frequency or low-frequency (by formation of a plasma). The recombination of the gas and the generation of a layer-forming species takes place primarily outside the plasma and also without the supply of external energy.

For this purpose, pulsed plasmas are usually used, the original gases are decomposed in a short energy pulse, then the power supply is switched off. The gas fragments can now be recombined again. $SiO_2$ which forms can be deposited on the substrate surface as a layer.

For the required quality of the coating, the ideal pulse-to-pause times depend upon the pressure conditions, the quantity of gas supplied and the supplied energy in the form of high frequency or of other electromagnetic radiation. The pulse length and pulse power should therefore be chosen so that the precursor molecules present achieve the required degree of dissociation. Longer pulses or extremely high pulse powers deliver no advantage, if all gas molecules are already dissociated (saturation). Therefore, the pulses are chosen to be as short as possible and have a sufficiently high power.

The ideal pulse length is greatly dependent upon the geometry present, the process pressure and also the quantity of gas supplied. Particularly preferably, after the plasma pulse everything should be vented, the "exhaust gases" should be transported away and the surroundings of the surface should be topped up with a fresh precursor gas mixture.

Longer pause times are disadvantageous, since then unconsumed gas is unnecessarily pumped out and the coating time is unnecessarily prolonged. Pause times which are too short result in the concentration of the precursor still being too low and cause recombined molecules to be dissociated again.

Thus, it is possible, for example, for the coating of 0.25 l bottles at a process pressure of for instance 0.6 mbar and a gas flow of approximately 300 sccm (standard cubic centimetre per minute), to replace the complete volume of the container once in approximately 30 ms. Pause times are therefore selected within this order of magnitude. As mentioned, the shortest possible pulses with high power are chosen for the pulses. In the context of embodiments of the invention described in greater detail below pulse lengths of approximately 5 to 10 ms at 0.8 to 1.6 kW pulse power are used.

However, the technology described here is also very expensive, for example due to the power supply units used.

SUMMARY

An aspect relates to an apparatus for coating objects, and in particular containers, has at least a first and a second coating station, wherein these coating stations in each case have at least a first coating electrode and a second coating electrode, as well as a supply device for electrical supply in each case to at least one of the coating electrodes, that is to say in particular at least one of the two coating electrodes of each of the coating stations.

According to embodiments of the invention the supply device has a high-frequency generator device for generating an a.c. voltage and/or voltage pulses as well as an a.c. voltage distribution device, which distributes this a.c. voltage respectively to at least one electrode of the first coating station and of the second coating station. In this case the a.c. voltage distribution device is suitable and intended for distributing the a.c. voltages and/or the voltage pulses with a time delay to the electrodes and in particular to the electrodes of at least two different coating stations and/or the at least two coating stations. In this way in particular two electrodes of two coating stations can be supplied with the voltage pulses with a time delay. In this way different coating stations or the electrodes thereof are preferably supplied with voltage pulses with a time delay.

An a.c. voltage is understood below to be a voltage which over time changes at least temporarily. In particular, voltage pulses, such as are used for plasma coating, are also understood as a.c. voltage.

In a preferred embodiment at least one of the electrodes can be introduced into the container. In particular in this case the electrode can be introduced via a mouth of the container into the container.

For this purpose, the apparatus can have a driving device which effects a movement of the electrode and/or a movement of the container. In this case it is possible that the second electrode or the counter electrode is arranged outside the container. However, it would also be possible that in principle both electrodes are preferably introduced simultaneously into the container. In a further advantageous embodiment at least one electrode is designed as a rod-like body and in particular as a body having a cross-section which is smaller than a mouth cross-section of a container.

However, it would also be possible that the electrode is fixed in the chamber and the container is guided (in particular along the axis) by means of the lance/electrode.

The containers are preferably plastic containers and in particular containers made from PET.

In a further advantageous embodiment, the apparatus has a transport device which transports the containers and/or the coating stations along a predetermined transport path. In this case this transport device also transports the containers in particular during the plasma coating process.

Thus, it is possible that the at least one electrode is introduced into the container while this container is being transported on the predetermined transport path.

The apparatus particularly preferably has a support on which a plurality of coating stations is arranged. Particularly preferably in this case the support is a rotatable support or a support wheel, on which this several coating stations are provided or arranged.

Alternatively, the coating stations are arranged stationary. Thus, for example and preferably, it is possible that the coating station(s) are arranged fixed in space and the containers are transported to a plasma chamber of this coating station (and also away from it after the coating). Therefore, in a preferred embodiment at least one and preferably a plurality of coating stations is/are arranged stationary and the containers are fed thereto.

The apparatus has at least three, preferably at least four, particularly preferably at least five coating stations.

As mentioned above, the power supply units described above are costly. Whereas in the conventional art one individual power supply unit is usually required for every plasma station, within the context of embodiments of the invention it is proposed to use one power supply unit for several stations. In the conventional art these power supply units are only activated for approximately 5 to 10 ms and then for approximately 30 ms in a paused state. Thus, in terms of hardware, in the conventional art these power supply units are operated with a load capacity of less than 25% and thus in an inefficient manner. In connection with embodiments of the invention a more efficient load capacity of the power supply unit is possible.

Also, in the conventional art it is not readily possible to operate several plasma stations simultaneously with a power supply unit, since otherwise the total pulse power would have to be even higher, which drives the price even higher.

Furthermore, the various plasma stations influence one another and a uniform distribution of an HF pulse to several plasma chambers would hardly be possible.

In fact, in the conventional art if a station has any problem, with the pressure, the quantity of gas, a delayed plasma ignition and the like, this will also have an effect on the adjacent stations.

Due to the distribution of the pulses proposed according to embodiments of the invention, for example by means of a multiplexer described in greater detail below, this dependence can also be eliminated, that is to say the individual stations are independent of one another.

It is therefore proposed that several plasma stations or coating stations are supplied simultaneously and independently of one another with plasma from a generator, and individual pulses in quick succession are only assigned to individual stations.

The a.c. voltage distribution device is preferably a multiplexer. A multiplexer is understood to be a selection circuit in analogue and digital electronics, by which from a number of input signals one is selected and can be switched through to the output. Thus, multiplexers are comparable with rotary switches, which are not set manually, but by electronic signals. In this case integrated semiconductor circuits are preferably provided which make these the electrical connections.

Thus, embodiments of the invention propose the use of a multiplexer which distributes the individual high-frequency pulses to the individual plasma stations according to a pattern, and in particular a predetermined and uniform pattern.

The pulses are particularly preferably distributed in such a way that at any time only a maximum of one single plasma is active, wherein preferably the individual coating stations or plasma stations can ignite with a time delay, for example with a time delay by several milliseconds.

Thus, as a result, as many coating stations are operated jointly on one generator as there are pulse lengths in one entire cycle time.

In this way it is possible to make savings on both space and also costs. Also, the complexity of control is also reduced. In addition, a greater efficiency in the load capacity of individual generators can also be achieved.

In a preferred embodiment a high-frequency generator is provided, by means of which a plasma pulse can be generated, wherein the couplable power thereof can be adapted on the basis of a measurement value of the reflected power. This could take place, for example, by an adaptation of the coupled power or an impedance adjustment. As a result, the target value of the coupled power can be achieved.

In one embodiment it is provided that the couplable power of each single plasma pulse can be adjusted individually on the basis of a measured value of a test pulse. For this purpose, it is provided that each plasma pulse is preceded by a pre-pulse with lower power and the power of the plasma pulse is adaptable to an individual target value on the basis of a measurement value of the reflected power. This has the advantage that the required plasma energy is applied to each container, regardless of the shape or material composition thereof. This embodiment is preferred in particular when a large number of individually different containers are to be coated.

As an alternative to this, another embodiment has proved particularly advantageous. In this case a high-frequency generator is likewise provided, by means of which plasma pulses can be generated, wherein the couplable power thereof can be adapted on the basis of a measurement value of the reflected power. Unlike what has been described above, the adaptation of the couplable power of a plasma pulse takes place on the basis of a measurement value, preferably several measurement values of one or preferably several preceding plasma coatings. This has the advantage that not every plasma pulse has to be preceded by a pre-pulse with lower power. Pre-pulses actually have the disadvantage that, due to the lower energy provided, coating reactions can start, but the chemical reactions provided do not proceed to completion. This can lead to undesirable intermediate products, a necessary higher demand for reactants and/or an impaired barrier effect of the deposited material. A further important advantage resides in speeding up the conduct of the method, since a time of several milliseconds is required for the pre-pulse, the measurement of the reflected energy and the setting of the couplable power on the basis of this measurement value. In the method proposed above, in which the plasma coating takes place in several stations, these intervals add up to total times which cause a significant slowing of the coating process. This is disadvantageous in particular in the case of high-throughput processes such as the container treatment.

A control device is preferably provided with a storage device which performs an adjustment of a predetermined target value for the subsequent coating process with at least one measurement value of a preceding coating process. In a preferred embodiment at least one measurement value is selected from a group which comprises a reflected power, a supplied power, a difference between a supplied and a reflected power, the power coupled into the plasma, an optical emission of the plasma, a gas volumetric flow rate, a gas composition (for example in the container, in the feed stream and/or in the exhaust gas stream), a temperature of the gas lance and a temperature of a container surface, individually or in combination. These values have proved particularly suitable in order to be able to predict the required power for a future plasma pulse particularly accurately.

In a preferred embodiment several of the parameters from the above-mentioned group are determined and their influence on the calculation of the required power is weighted with an individual factor for a future plasma pulse. Thus, an individual factor is assigned for calculation of the power of one, several or all of the above-mentioned parameters. This facilitates a simple adaptation of the calculation on the basis of empirical values from preceding calculations.

In a further preferred embodiment, an evaluation device is provided, which determines the factor with which a parameter is included in the calculation for determining a couplable power. This evaluation device preferably uses a comparison of parameters of past measurements for determining a factor for future coating processes. In particular it is preferable that the factor(s) determined by the evaluation device(s) is/are dynamically variable. It is particularly preferable that the determined factor(s) are determined again after a predetermined number of coating processes. In this connection it is conceivable that older measurement values of a parameter are taken into consideration to a lesser extent in the determination of a factor. As a result, it can be ensured that the evaluation device determines a factor again at predetermined intervals and adapts it, if applicable.

In particular it is preferable that the evaluation device comprises an AI system. This makes it possible that the evaluation device, for example, recognizes patterns and adapts the factor(s) accordingly. A pattern recognition makes it possible to deduce a prediction as to how an incoming individual pulse, an incoming pulse sequence and/or the further process will behave. The factor(s) can be adapted taking account of this prediction.

A validation device is preferably provided, which compares the actual and target values of a pulse and/or coating process. Such a comparison can be used for example in order to protect the system. If for example a fed power is so high that the reflected power thereof is very close to the power limit (for example 10% below the upper power limit) of the generator, a forced limitation of the power could take place.

The validation device is preferably suitable for checking whether a change of the factor or the factors has brought about an improvement of the process. For example, a coating result could be taken into consideration for validation. A corridor is preferably defined, within which parameters used for the validation considered must move. In this way it can be ensured that a process is not permanently impaired (for example by an incorrectly running process, an interruption before the process or an interruption during the process). Thus, when a corridor limit is reached or approached it is possible at an early stage to prevent the coating process from leading to a defective product. A system with such a validation device recognises, before unauthorised values outside the corridor are reached, that at least one parameter is outside the admissible range. It can then initiate a counteraction. In particular in combination with the AI system and/or data derived from preceding measurements and stored in the system, an adaptation of at least one factor can take place in order to keep the process within the defined corridor or to guide it back again into the defined corridor.

In a preferred embodiment several measurement values of the same parameter within one single pulse pattern can be taken into consideration by the evaluation device. This is advantageous in particular since individual parameters (for example the amount of fresh gas and/or the educt(s)/product(s) ratio of the chemical processes proceeding during the coating (for example in the gas volume)) can change during an individual pulse. Several parameters are influenced by the plasma itself. This can change the impedance of the plasma. When taking into consideration several measurement values of an individual parameter within one single pulse pattern, the evaluation device can adapt the factor(s) so that the coupled power particularly advantageously counteracts this change of the considered parameter(s) or supports this change. In particular it is advantageous that an AI system takes these parameters into consideration during a pulse and learns how they can optimally provide the coupled power.

In a further advantageous embodiment, the apparatus has a media feed device which is suitable and intended for feeding a flowable and in particular gaseous medium to the container and/or the containers. In particular in this case this is a gaseous medium which ultimately serves for coating the internal surface. Particularly preferably, a gas or a medium which includes at least the elements silicon (Si) and/or oxygen ($O_2$) can be used for coating. Thus, for example $SiO_2$ could be deposited.

In a further advantageous embodiment, the high-frequency generator device outputs the voltage in the form of voltage pulses. In this case these are particularly preferably rectangular pulses which, as mentioned above, are emitted to the individual coating stations with a time delay.

As mentioned above, the high-frequency generator device can also output the voltage in the form of a combination of several voltage pulses. In this case these are particularly preferably several rectangular pulses, for example a pre-pulse with lower power and a main pulse (plasma pulse), which as mentioned above can follow one another with a time delay.

In a further advantageous embodiment, the a.c. voltage distribution device distributes the pulses output by the high-frequency generator device in each case completely to the individual electrodes. This means that each pulse is preferably assigned to precisely one coating station. There is preferably also no overlap between the pulses going to the individual coating stations.

Thus, no switchover of the multiplexer takes place during a pulse, but rather the pulse is emitted completely to one specific coating station. This relates particularly preferably to rectangular pulses, as mentioned above.

In a further preferred embodiment, the a.c. voltage distribution device is triggered by the generator device.

Particularly preferably a time interval between two pulses is shorter than the duration of the respective pulse.

Furthermore, embodiments of the present invention are directed to a method for coating objects and in particular containers, wherein at least one first and one second coating station is used. In this case these coating stations each have at least one first coating electrode and one second coating electrode and at least one of the coating electrodes is supplied with electrical energy by a supply device.

According to embodiments of the invention, by means of a high-frequency generator device a supply device provides an a.c. voltage and in particular voltage pulses, and an a.c. voltage distribution device distributes this a.c. voltage and/or these voltage pulses to at least one electrode of the first coating station and at least one electrode of the second coating station. In this case the a.c. voltage distribution device distributes the a.c. voltages with a time delay to the respective electrodes and/or the coating stations. The a.c. voltage is preferably distributed with a time delay to the respective electrodes of the two coating stations.

It is therefore also proposed in terms of the method that the respective voltage pulses, which are necessary for generating the plasma, are distributed to the individual coating stations. Thus, the individual coating stations do not influence each other, so that for instance any defects of individual coating portions which may occur do not also lead to a malfunction in the other coating stations.

In a further preferred method, a control device controls the high-frequency generator device in such a way that voltage pulses are emitted at predetermined time intervals. Particularly preferably in this case the length of a voltage pulse is longer than the time interval between two pulses.

Thus, by a suitable choice of the respective pause times between the individual voltage pulses, as many coating stations as possible are operated by means of a generator device.

The pulses preferably have a pulse length which is greater than 2 ms, preferably greater than 3 ms, preferably greater than 4 ms and particularly preferably greater than 5 ms.

Particularly preferably the voltage pulses have a temporal length which is less than 40 ms, preferably less than 30 ms, preferably less than 20 ms, preferably less than 15 ms and preferably less than 10 ms. In a further preferred method, a pulse power of the voltage pulse is greater than 0.4 kW, preferably greater than 0.5 kW, preferably greater than 0.6 kW and preferably greater than 0.7 kW.

In a further preferred method, a pulse power of the pulses is less than 4 kW, preferably less than 3 kW, preferably less than 2 kW and particularly preferably less than 1.7 kW.

The pause times between two pulses are preferably less than 20 ms, preferably less than 15 ms, preferably less than 10 ms, preferably less than 7 ms, preferably less than 5 ms and particularly preferably less than 3 ms.

However, the pause times between two pulses which the high-frequency generator device emits are also dependent upon the number of stations to be supplied.

Thus, it would be possible for example that for each individual coating station the pulse pause duration is 30 ms and the pulse duration is 8 ms. The pulses which the generator emits and then distributes to the individual stations are ideally situated so far apart in terms of time that they are uniformly distributed.

If for example only two stations are fed, the second pulse lies centrally in the pause of the first station. The pulse sequence of the generator is then 8 ms 'on'-11 ms 'off'-8 ms 'on'-11 ms 'off' etc. In this case each individual station sees 8 ms 'on'-30 ms 'off'.

The two electrodes or the electrodes of both coating stations are preferably operated independently of one another.

In a further preferred method, the high-frequency generator device outputs the a.c. voltage in the form of voltage pulses. In this case they are preferably rectangular pulses.

In a further preferred method, a control device controls the high-frequency generator device in such a way that the voltage pulses are emitted at predetermined time intervals. Particularly preferably the voltage pulses are emitted at substantially constant time intervals.

In a further preferred method, the a.c. voltage distribution device distributes the voltage pulses in such a way that at a predetermined time no more than one coating station is supplied with voltage.

Particularly preferably, the individual stations are supplied in a predetermined sequence.

BRIEF DESCRIPTION

Some of the embodiments will be described in detail, with reference to the following figures, wherein like designations denote like members, wherein.

DETAILED DESCRIPTION

Figure 1:
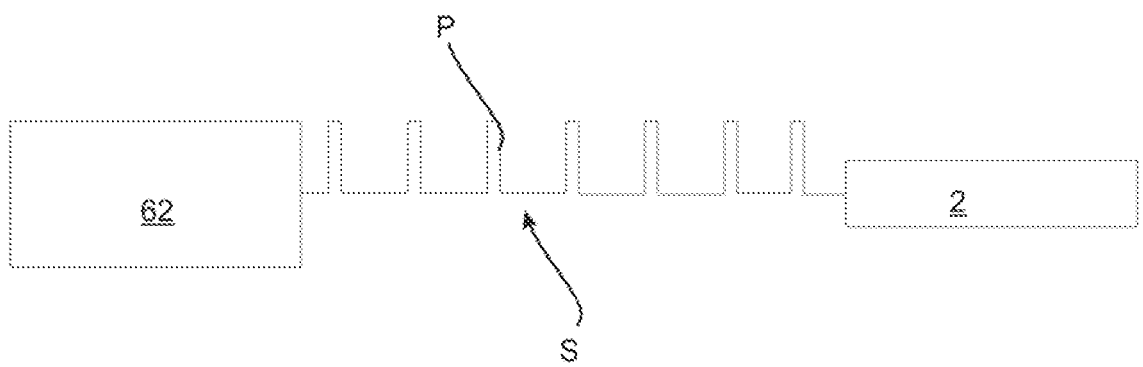
FIG. 1 shows an arrangement according to the conventional art.

FIG. 1 shows a representation of an embodiment which is known from the conventional art. In this case a high-frequency generator 62 is provided, which generates voltage P which are in each case output to a coating station 2 at predetermined time intervals relative to one another. In this case a high-frequency generator is provided for each coating station.

Figure 2:
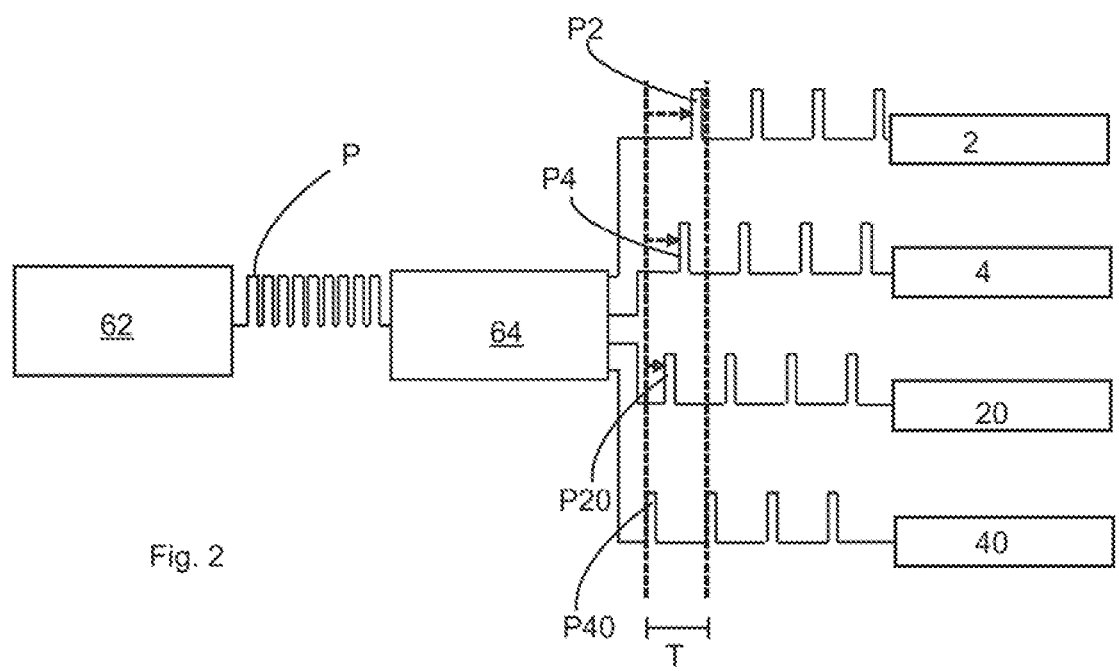
FIG. 2 shows a representation of an embodiment according to embodiments of the invention.

FIG. 2 shows a representation of an apparatus according to embodiments of the invention. Here likewise a high-frequency generator 62 is provided which outputs voltage pulses P. However, it will be seen here that these voltage pulses are output at substantially shorter intervals relative to one another than in the situation shown in FIG. 1.

In addition, an a.c. voltage distribution device, such as in particular a multiplexer 64, is provided, which distributes the individual pulses P in the form of pulses P2, P4, P20 and P40 with a time delay relative to one another to, in this case, four coating stations 2, 4, 20, 40.

In this case the reference T designates the interval in which all pulses are emitted. It will be recognised that the individual pulses P2, P4, P20 and P40 have a time delay relative to one another.

Figure 3:
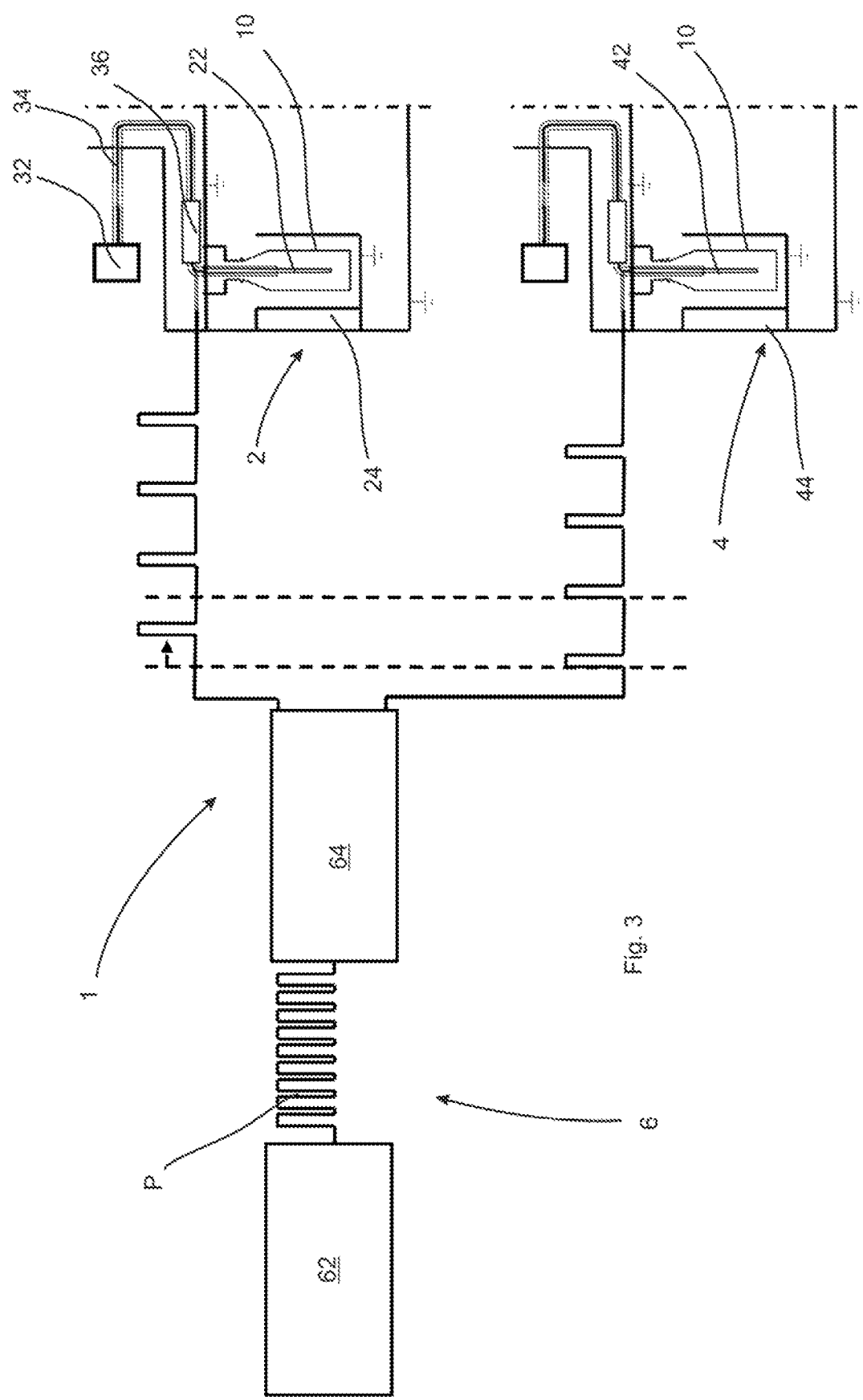
FIG. 3 shows a further representation of a device according to embodiments of the invention.

FIG. 3 shows a more detailed representation of an apparatus 1 according to embodiments of the invention. In this case the reference 6 relates to a supply device which has the high-frequency generator 62 and the a.c. voltage distribution device 64.

In the embodiment shown here the voltage pulses are distributed with a time delay to two coating stations.

These coating stations 2, 4 each have a first electrode 22 or 42, which can be introduced into a container 10 to be coated. In addition, the coating stations 2, 4 each have a second electrode 24, 44, which is arranged outside the container 10. These second electrodes 24, 44 here are preferably earthed.

The reference 32 designates a media reservoir, for instance a reservoir for a gas mixture, for instance a mixture of $HMDSO+O_2$. The reference 34 designates a feed conduit in order to feed the medium to the containers, and the reference 36 designates a control device which controls the feeding of the medium into the containers 10. SiO$_2$ is produced first in the plasma in the container, more precisely between two plasma pulses.

Although the present invention has been disclosed in the form of preferred embodiments and variations thereon, it will be understood that numerous additional modifications and variations could be made thereto without departing from the scope of the invention.

For the sake of clarity, it is to be understood that the use of "a" or "an" throughout this application does not exclude a plurality, and "comprising" does not exclude other steps or elements. The mention of a "unit" or a "module" does not preclude the use of more than one unit or module.

LIST OF REFERENCES 1 apparatus
2, 4 coating station
6 supply device
10 container
22, 42 first electrode
24, 44 second electrode
32 media reservoir
34 media conduit
36 control device
62 high-frequency generator device
64 a.c. voltage distribution device, multiplexer
P voltage pulse
P2, P4, P20, P40 distributed voltage pulses
T period

The invention claimed is:

1. An apparatus for coating objects wherein the objects are containers with at least one first and one second coating station, wherein these coating stations each have at least one first coating electrode and one second coating electrode, and with a supply device for electrical supply of at least one of the coating electrodes, wherein the supply device has a high-frequency generator device for generating at least one of an a.c. voltage and voltage pulses as well as at least one of an a.c. voltage distribution device designed as a multiplexer which distributes this a.c. voltage and the voltage pulses respectively to at least one coating electrode of the first coating station and of the second coating station, wherein the a.c. voltage distribution device is suitable and intended for distributing at least one of the a.c. voltages and the voltage pulses with a time delay to the coating electrodes, wherein the a.c. voltage distribution device distributes the pulses output by the high-frequency generator device completely to the individual electrodes in such a way that each pulse is assigned to precisely one coating station and there is no overlap between the pulses going to the individual coating stations.

2. The apparatus according to claim 1, wherein the voltage pulses have a temporal length less than 40 ms.

3. The apparatus according to claim 1, wherein the apparatus has a movable, rotatable transport device on which the coating stations are arranged.

4. The apparatus according to claim 1, wherein the coating stations are arranged stationary.

5. The apparatus according to claim 1, wherein the apparatus has a media feeding device which is suitable and intended for feeding a flowable, gaseous medium to at least one of the containers.

6. The apparatus according to claim 1, wherein high-frequency generator outputs the voltage in the form of voltage pulses.

7. The apparatus according to claim 1, wherein power applied by the high-frequency generator device to a container is adaptable on the basis of a measured value of power reflected by a container.

8. The apparatus according to claim 7, further comprising a control device with a storage device by which a predetermined target value for a subsequent coating process is adjustable with at least one measurement value of a preceding coating process, wherein at least one measurement value is a measurement value selected from a group which comprises a power reflected by a container, a supplied power, a difference between a supplied and a reflected power, a power applied into a plasma, an optical emission of the plasma, a gas volumetric flow rate, a gas composition, a temperature of a gas lance, and a temperature of a container surface, individually or in combination.

9. The apparatus according to claim 8, further comprising an evaluation device which can determine a factor with which a parameter is included in a calculation for determining a couplable power.

10. The apparatus according to claim 9, wherein the evaluation device comprises an AI system recognizing patterns and, based thereon, adapting the factor.

11. A method for coating objects wherein the objects are containers with at least one first and one second coating station, wherein these coating stations each have at least one first coating electrode and one second coating electrode, and wherein with a supply device at least one of the coating electrodes is supplied with electrical energy, comprising the steps of: by means of a high-frequency generator device providing a supply device with at least one of an a.c. voltage and voltage pulses, and an a.c. voltage distribution device designed as a multiplexer distributing at least one of this a.c. voltage and the voltage pulses respectively to at least one coating electrode of the first coating station and at least one coating electrode of the second coating station, wherein the a.c. voltage distribution device distributes at least one of the a.c. voltages and the voltage pulses with a time delay to the coating electrodes, and wherein the a.c. voltage distribution device distributes the pulses output by the high-frequency generator device completely to the individual electrodes in such a way that each pulse is assigned to precisely one coating station and there is no overlap between the pulses going to the individual coating stations.

12. The method according to claim 11, wherein the high-frequency generator outputs the a.c. voltage in the form of voltage pulses.

13. The method according to claim 11, wherein a control device controls the high-frequency generator device in such a way that the voltage pulses are emitted at predetermined time intervals.

14. The method according to claim 11, wherein the a.c. voltage distribution device distributes the voltage pulses in such a way that at a predetermined time no more than one coating station is supplied with voltage.

15. The method according to claim 11, wherein the voltage pulses have a temporal length less than 40 ms.

* * * * *